United States Patent [19]
Davis
[11] 3,869,321
[45] Mar. 4, 1975

[54] METHOD FOR FABRICATING PRECISION LAYER SILICON-OVER-OXIDE SEMICONDUCTOR STRUCTURE

[75] Inventor: Stanley R. Davis, Cupertino, Calif.
[73] Assignee: Signetics Corporation, Sunnyvale, Calif.

[22] Filed: June 27, 1973
[21] Appl. No.: 373,940

Related U.S. Application Data

[60] Division of Ser. No. 219,542, Jan. 20, 1972, abandoned, which is a continuation of Ser. No. 38,754, May 19, 1970, abandoned.

[52] U.S. Cl. .................... 148/175, 29/577, 29/580, 117/213, 117/215, 148/191, 357/50
[51] Int. Cl. .................... H01l 7/36, H01l 27/04
[58] Field of Search .................... 148/174, 175, 191; 317/235 E, 235 F; 117/201, 213, 215; 29/577, 580

[56] References Cited

UNITED STATES PATENTS

| | | | |
|---|---|---|---|
| 3,327,182 | 6/1967 | Kisinko | 317/235 |
| 3,335,341 | 8/1967 | Lin | 317/235 |
| 3,390,022 | 6/1968 | Fa | 317/235 F X |
| 3,424,955 | 1/1969 | Seiter et al. | 317/235 F X |
| 3,448,344 | 6/1969 | Schuster et al. | 317/234 X |
| 3,460,006 | 8/1969 | Strull | 317/235 |
| 3,595,713 | 7/1971 | Brebisson et al. | 148/175 |
| 3,787,710 | 1/1974 | Cunningham | 317/235 F X |

OTHER PUBLICATIONS

Wu, B. P. F., "Semiconductor Fabrication . . . of Integrated Devices," I.B.M. Tech. Discl. Bull., Vol. 8, No. 12, May 1966, p. 1846–47.

*Primary Examiner*—L. Dewayne Rutledge
*Assistant Examiner*—W. G. Saba
*Attorney, Agent, or Firm*—Flehr, Hohbach, Test, Albritton & Herbert

[57] ABSTRACT

Semiconductor structure having a support structure with a layer of single crystal material carried by the support structure and a layer of epitaxially grown single crystal semiconductor material adherent to the first named layer of semiconductor material to provide a combination layer having a relatively precise thickness throughout in which circuit devices can be fabricated.

Method for fabricating semiconductor structure by providing a body of single crystal semiconductor material and forming a support structure therefor and thereafter growing an epitaxial layer of single crystal semiconductor material on the first named layer to provide a combination layer which has a precise thickness throughout.

1 Claim, 14 Drawing Figures

INVENTOR
Stanley P. Davis
BY
Flehr, Hohbach, Test, Albritton & Herbert
Attorneys

METHOD FOR FABRICATING PRECISION LAYER SILICON-OVER-OXIDE SEMICONDUCTOR STRUCTURE

CROSS-REFERENCE TO RELATED APPLICATION

This application is a division of application Ser. No. 219,542, filed Jan 20, 1972, now abandoned, which is a continuation of application Ser. No. 38,754, filed May 19, 1970, now abandoned.

BACKGROUND OF THE INVENTION

Silicon-over-oxide semiconductor structures have heretofore been provided. However, it has been found that the single crystal silicon layer which normally has been provided in such a structure is relatively imprecise in thickness which makes it quite difficult to build high speed, high density circuit devices. There is, therefore, a need for a new and improved silicon-over-oxide semiconductor structure and method which will ovecome such a disadvantage.

SUMMARY OF THE INVENTION AND OBJECTS

The semiconductor structure consists of a support structure with a layer of single crystal semiconductor material carried by the support structure. A layer of epitaxially grown single crystal semiconductor material is adherent to the first named layer of semiconductor material and in combination form a combination layer having a precise and uniform thickness throughout. In addition, it has a substantially planar surface.

In the method, a semiconductor body of single crystal material is provided and thereafter a support structure is provided for carrying the body. In order to obtain a layer of single crystal semiconductor material which has a relatively precise thickness, a layer of epitaxially grown material is formed on the first named layer of single crystal semiconductor material. Devices can thereafter be grown therein.

In general, it is an object of the present invention to provide a semiconductor structure and method which makes it possible to provide high speed and high density devices.

Another object of the invention is to provide a structure and method of the above character in which there is provided a layer of single crystal semiconductor material which has a relatively precise thickness throughout.

Another object of the invention is to provide a semiconductor structure and method of the above character in which it is possible to provide relatively large buried layers with a very small increase in capacitance.

Another object of the invention is to provide a semiconductor structure and method of the above character in which it is possible to provide diffusion isolation.

Another object of the invention is to provide a semiconductor structure of the above character which is relatively simple to fabricate.

Additional objects and features of the invention will appear from the following description in which the preferred embodiments are set forth in detail in conjunction with the accompanying drawings.

DESCRIPTION OF THE PREFERRED EMBODIMENT

Figures 1, 2, 3, 4, 5, 6, 7, 8, 8A, 8B, 9, 10, 11, 12:
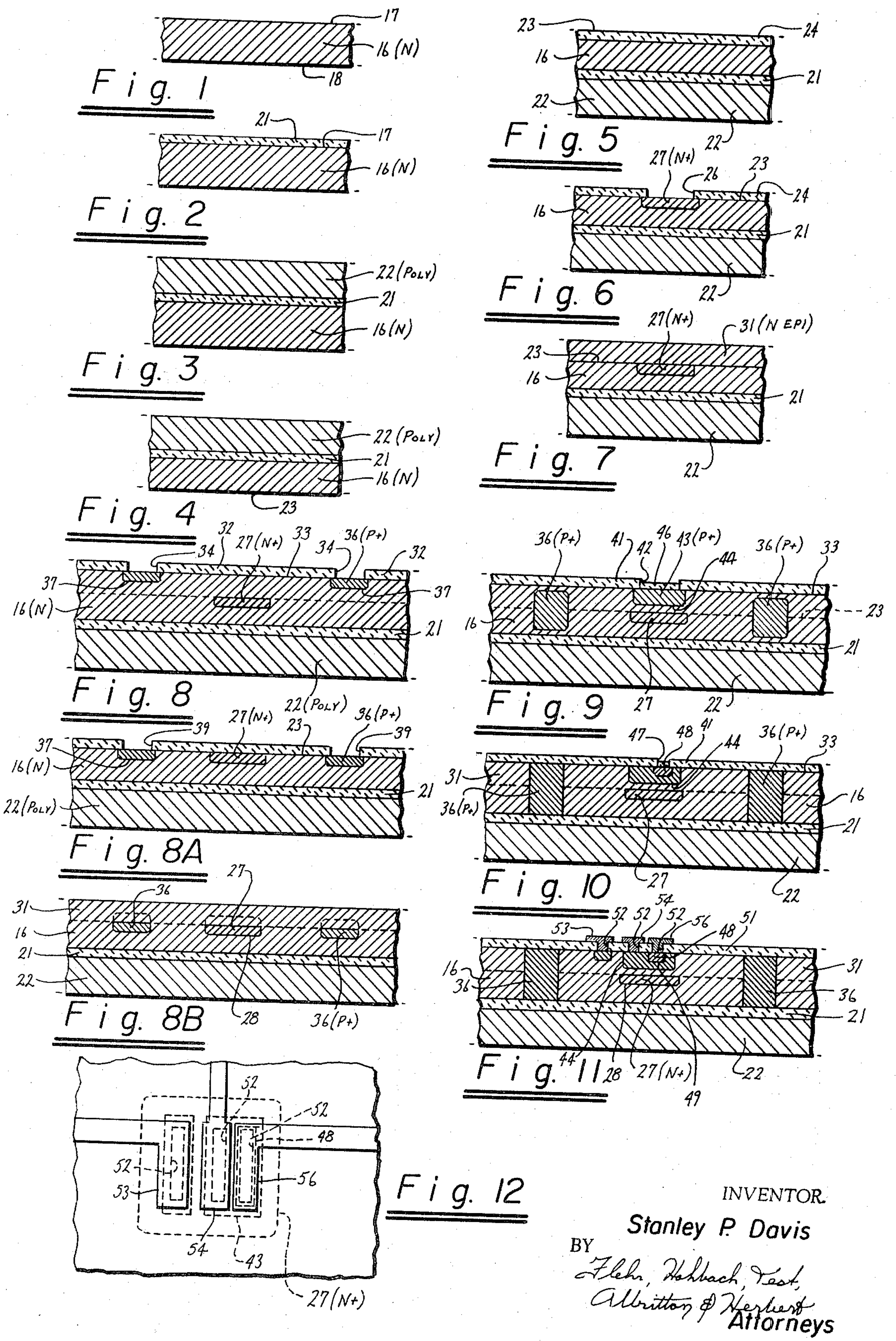
FIGS. 1 – 8 are greatly enlarged cross-sectional views of a semiconductor structure incorporating the present invention and showing the steps utilized in fabricating the semiconductor structure.
FIGS. 8A and 8B show an alternative construction to that shown in FIG. 8.
FIGS. 9 – 11 are greatly enlarged cross-sectional views showing the additional steps required to form circuits in the structures shown in FIGS. 8 and 8B.
FIG. 12 is a plan view of the semiconductor structure shown in FIG. 11.

The steps for forming the silicon-over-oxide semiconductor structure with precision layer is shown in FIGS. 1–12. In commencing the fabrication of such a semiconductor structure, a semiconductor wafer or body 16 is utilized. Typically, this semiconductor body is formed of silicon and is provided with an N-type impurity. The body or wafer 16 is provided with generally planar parallel upper and lower surfaces 17 and 18 which have been ground and polished. A layer 21 of silicon dioxide is grown on the outer surfaces of the body 16 in a conventional manner as shown in FIG. 2.

A handle or support structure 22 is then deposited upon the oxide layer covering the surface 17. Typically, this support structure 22 can take the form of polycrystalline silicon which is deposited on the silicon dioxide layer 21. After this has been accomplished, a portion of the original silicon body is removed either mechanically or chemically in a conventional manner to provide a semiconductor body 16 which has a relatively precise thickness. Mechanical removal can be accomplished by grinding and polishing, whereas the chemical removal can be obtained by chemical etching. In any event, a new surface 23 is provided on the semiconductor body 16. In the formation of the semiconductor body 16 as shown in FIG. 4, it has been found that the edges may be rounded and that the thickness of the body can vary from one side of the wafer to the other so that, in fact, the single silicon layer 16 is slightly bevelled. In order to overcome this difficulty, a silicon dioxide layer 24 is grown on the surface 23 of the silicon semiconductor body 16. A photoresist layer is then deposited on the oxide layer 24. The photoresist is exposed through a suitable mask and then developed. The unexposed portions of the photoresist are removed and thereafter an etch is utilized to attack the silicon dioxide which has been exposed through the photoresist so that there is formed an opening or window 26 in the layer 24 which exposes a portion of the surface 23 of the silicon semiconductor body 16. A buried layer is then formed in the semiconductor body 16 by diffusing a suitable impurity such as arsenic through the window 26 to form a region 27 which is bounded by a dish-shaped N-N+junction that extends to the surface 23 beneath the oxide layer 24.

After the buried layer 27 has been formed, the oxide layer 24 is stripped from the surface 23 by suitable means such as an etch. An epitaxial layer 31 of N-type silicon is then grown on the surface 23 of the N-type silicon body 16. This epitaxial layer 31 is grown to a precise thickness so that in combination with layer 16 a combination layer is formed having a precise predetermined thickness which is desired for the semiconductor structure as hereinafter described.

Thereafter, as shown in FIG. 8, a silicon dioxide layer 32 is provided on the surface 33 of the epitaxial layer 31. Windows 34 are then formed in the oxide layer 32 in a conventional manner. For example, photoresist can be applied to the oxide layer and the photoresist exposed through a mask. The photoresist is then developed so that the unexposed portions are removed and thereafter a suitable etch is utilized to etch away the exposed portions of the silicon dioxide to form the windows 34. A P-type impurity such as boron is then diffused through the windows 34 to form P-type regions 36 defined by a dish-shaped P-N junction 37 which extends to the surface 33.

In FIGS. 8A and 8B an alternate method is shown. Rather than introducing the P-type isolation regions after the epitaxial layer has been grown, it is possible to form the P-type isolation regions prior to the growth of the epitaxial layer 31. Thus, prior to the steps shown in FIG. 7 and after the step shown in FIG. 6, windows 39 can be formed in the oxide layers 24 in the same manner as hereinbefore described and thereafter a P-type impurity is diffused through the windows to form the P-type regions 36 which are enclosed within dish-shaped P-N junctions 37 which extend to the surface 23. As soon as this has been accomplished, the oxide layer 24 can be stripped and thereafter the epitaxial layer 31 can be grown. During the time that this epitaxial layer 31 is being grown, the P-type regions 36 and the N+ region 27 will diffuse upwardly into the epitaxial layer as shown in FIG. 8B.

At this point, as can be seen from FIGS. 8A and 8B, there is provided a basic three-layer structure. The first is a single crystal silicon layer formed by the combined epitaxial layer 31 and the semiconductor body 16, the silicon dioxide layer 21 and the polycrystalline silicon support layer 22. There is provided in the N-type single crystal material P+ regions 36 which will diffuse upwardly and downwardly in the single crystal silicon layer to complete the isolation of the various electrical components formed in the semiconductor structure. In the center there is provided the N+ region 27 which will serve as an N+ arsenic buried region for the semiconductor structure.

In this way it can be seen that there has been provided a basic building block which can be utilized for building various semiconductor structures. The remainder of the steps can be substantially conventional. Thus, as shown in FIG. 9, a silicon oxide layer 41 can be grown on the surface 33 and a window 42 etched therein in the manner hereinbefore described to expose the single crystal semiconductor material below. A P-type impurity such as boron is then diffused through the window 42 to form a P-type region 43 which is disposed within a dish-shaped P-N junction 44 that extends to the surface 33 beneath the oxide layer. This region can serve as the base of a semiconductor device. During the base diffusion, a thin oxide layer 46 will grow within the window 42. During this base diffusion it can be seen that the P-type regions 36 have further diffused upwardly and downwardly in the single crystal semiconductor body. All of the oxide on the surface 33 can be stripped and regrown and a window 47 formed therein for the emitter diffusion. Alternatively, a window 47 can be formed in the thin oxide layer 46. An N-type impurity such as phosphorus is then diffused through the window 47 to form an N-type region 48 defined by a dish-shaped P-N junction 49 which extends to the surface 33 which is disposed within the P-N junction 44. During this emitter diffusion, the P+ isolation regions have diffused all the way to the silicon dioxide layer 21 and to the silicon dioxide layer 41. The oxide layer 41 again can be stripped and regrown to provide a silicon dioxide oxide layer 51. This silicon dioxide layer 51 is masked and etched in a conventional manner to provide a plurality of windows 52. Metallization of a suitable type such as aluminum is then deposited on the surface of the silicon dioxide layer 51. By conventional photolithographic techniques, the undesired aluminum metallization is exposed and etched either chemically or electrolytically so that there remains collector contact 53, base contact 54 and emitter contact 56 so that there is provided a completed semiconductor device which is electrically isolated from other semiconductor devices which may be formed in the semiconductor body.

The semiconductor structure and method hereinbefore described has many advantages. If it is desired to fabricate high frequency, high density circuits, it is very important to minimize parasitic capacitance which has a tendency to degrade the speed of the semiconductor device. The construction herein disclosed utilizing the silicon over oxide has the inherent advantage of drastically decreasing the collector to substrate parasitic capacitance which exists between the buried layer and the material which exists below the buried layer. In the silicon over oxide construction which is disclosed, the material which is below the N+ buried layer is silicon dioxide which has a far less inherent capacitance than with conventional P-type material. Active and passive devices can be formed in the silicon over oxide construction herein disclosed with relatively great precision because it is possible to grow the epitaxial layer 31 very precisely so as to maintain a tolerance of at least a ± 10 percent in overall thickness for the single crystalline semiconductor body in which the devices are formed.

For high speed integrated circuits, it is important to maintain exceedingly shallow diffusions in the single crystal silicon. By way of example, the base diffusion in a high speed circuit must be no greater than one micron in depth and must either make contact with the buried layer or within a specified distance of the buried layer. For this reason, it is important to know with precision the depth of the single crystalline semiconductor body from the top surface and the single crystal semiconductor body to the buried layer. If the buried layer is permitted to diffuse deeply before the epitaxial layer is deposited, then there will be lower collector resistance because the cross-sectional area of the buried layer will be larger. The more highly doped the material contained in the buried layer, the lower the collector saturation resistance and the collector time constant which is one of the speed determining factors. By utilizing the present construction, since the capacitance from the buried layer to the substrate material is far smaller than the conventional epitaxial material, it is possible to make the X–Y dimensions of the buried layer much larger without sacrificing any increase in capacitance. Thus, as shown in FIG. 12, the N+ buried layer can be very large and, in fact, can cover substantially the entire region between the diffused isolation posts. This makes it possible to decrease the collector saturation resistance without increasing the collector to substrate capacitance. Thus, with the present construction, there is a very small increase in capacitance when the buried layer is increased greatly in size.

In view of the foregoing, it can be seen that the silicon over oxide structure which has been provided has numerous advantages. It retains isolation and parasitic minimization which is possible with conventional silicon over oxide semiconductor material. The precision thickness of the single crystal semiconductor body in which the devices are fabricated makes possible the fabrication of high performance integrated circuits. The buried layer can be made much larger thus reducing switching times and the "power-speed" product.

I claim:

1. In a method for forming a silicon-over-oxide semiconductor structure with a precision layer, providing a semiconductor body of single crystalline silicon having first and second surfaces forming a layer of silicon dioxide on said first surface, forming a support structure on said layer of silicon dioxide, removing a portion of the body of single crystalline silicon by removing material from said second surface to provide a continuous layer of single crystal semiconductor material of a predetermined thickness adherent to said layer of insulating material, forming a buried layer of the same conductivity type as the semiconductor body in said body through said second surface, forming a region of opposite conductivity type in said body through said second surface and surrounding said buried layer, epitaxially growing a layer of single crystalline silicon on said second surface of said body to provide in combination with said body a combination layer which has a precise and uniform thickness throughout and which has a substantially planar surface, forming a layer of silicon dioxide on said planar surface, causing said region of opposite conductivity type to diffuse upwardly and downwardly so they extend between the first named layer of silicon dioxide and the layer of silicon dioxide on said planar surface so that the portion of semiconductor material enclosed within the opposite conductivity material is junction isolated from the other portions of the semiconductor material and forming a transistor in said epitaxial layer overlying said buried layer.

* * * * *